(12) United States Patent
Toyoshima et al.

(10) Patent No.: US 6,687,984 B1
(45) Date of Patent: Feb. 10, 2004

(54) METHOD FOR MANUFACTURING FLEXIBLE MULTILAYER CIRCUIT BOARD

(75) Inventors: Akihiko Toyoshima, Kashima-Gun (JP); Katsunori Kokubun, Kashima-Gun (JP); Kunihiko Azeyanagi, Kashima (JP)

(73) Assignee: Nippon Mektron, Ltd., Tokyo (JP)

( * ) Notice: Subject to any disclaimer, the term of this patent is extended or adjusted under 35 U.S.C. 154(b) by 375 days.

(21) Appl. No.: 09/786,006

(22) PCT Filed: Jun. 27, 2000

(86) PCT No.: PCT/JP00/04200

§ 371 (c)(1),
(2), (4) Date: Feb. 28, 2001

(30) Foreign Application Priority Data

Jul. 19, 1999 (JP) .......................................... 11-204247

(51) Int. Cl.[7] .............................................. H05K 3/20
(52) U.S. Cl. ...................................... 29/830; 29/831
(58) Field of Search .......................... 29/829, 830, 831; 361/736

(56) References Cited

U.S. PATENT DOCUMENTS 6,519,843 B2 * 2/2003 Lauffer et al. ................ 29/840

FOREIGN PATENT DOCUMENTS

| JP | 62-156847 | | 7/1987 |
| JP | 2-44794 | * | 2/1990 |
| JP | 9-82837 | | 3/1997 |

OTHER PUBLICATIONS

PCT/JP00/04200, Jun. 27, 2000, Japan, International Search Report.

* cited by examiner

Primary Examiner—Timothy V. Eley
(74) Attorney, Agent, or Firm—Alix, Yale & Ristas, LLP

(57) ABSTRACT

An internal layer circuit board to which an opening portion 14 is provided at a predetermined position and a required wiring pattern 1 is formed so as to expose a terminal portion 1A to the opening portion 14 is manufactured. Subsequently, single-sided copper-clad laminates are superimposed on both sides of the internal layer circuit board through interlayer adhesive layers 6 and 7 to which another opening portion 14 is provided at a position corresponding to the opening portion 14, and two piercing slits S are previously formed to the single-sided copper-clad laminate at corresponding positions placed outside from edges of the opening portion 14 by a predetermined distance in accordance with two opposed sides of the opening portion 14. Required wiring patterns are formed to conductive layers 10 and 13 of the respective copper-clad laminates, and an unnecessary removal piece 19 is finally taken off by punching out the single-sided copper-clad laminate at a position including respective both ends of the two slits S, thereby exposing the opening portion 14 of the internal layer circuit board 15 including the terminal portion 1A.

4 Claims, 3 Drawing Sheets

METHOD FOR MANUFACTURING FLEXIBLE MULTILAYER CIRCUIT BOARD

CROSS-REFERENCE TO RELATED APPLICATION

This is the U.S. national phase of International Application No. PCT/JP00/04200 filed Jun. 27, 2000.

TECHNICAL FIELD

The present invention relates to a method for manufacturing a multilayer circuit board, and more particularly to a method for manufacturing a flexible multilayer circuit board having a hollow terminal portion and the like formed in an internal layer.

BACKGROUND ART

This type of multilayer circuit board may have a configuration requiring a terminal portion for a connector terminal and the like to an internal layer circuit board owing to circumstances of a wiring pattern. As such a primary configuration, there is a flexible multilayer circuit board provided with a terminal portion in a cable portion thereof. In general, gold plating or solder plating is performed to such a terminal portion.

If electrical conduction can be attained to the terminal portion after laminating an external layer circuit board on the internal layer circuit board, there is no problem. However, if such mutual conduction can not be achieved, plating must be carried out at the stage of forming a wiring pattern on the internal layer circuit board.

However, since the terminal portion of the internal layer circuit board must be exposed on the surface eventually, it is preferable to laminate the external layer circuit board corresponding to the terminal portion as a window, but there are processes such as wiring patterning of the external layer circuit board, erosion of the gold coating or the solder coating as well as through hole plating after the laminating process.

Under the present situation, the external layer circuit board is laminated in the window configuration such that the terminal portion of the internal layer circuit board is provided to the external layer circuit board, and the terminal portion must be masked in each of stages of through hole plating or etching. In such a case, an adhesive tape having the chemical resistance is generally used for the masking process, but the process may be troublesome because the tape must be attached each time. Further, there may occur such a problem as that the tape can be peeled off during the process.

It is, therefore, an object of the present invention to provide a method for manufacturing a flexible multilayer circuit board characterized in that an external layer copper-clad laminate is directly used as a masking material in order to efficiently achieve masking with respect to the terminal portion of the internal layer circuit board without adopting masking means such as a tape described above.

DISCLOSURE OF THE INVENTION

To achieve this aim, the present invention provides a method for manufacturing a flexible multilayer circuit board comprising the steps of: producing an internal layer circuit board to which a required wiring pattern is formed so as to provide a opening portion at a predetermined position and expose a terminal portion to the opening portion; laminating a single-sided copper-clad laminate through each interlayer adhesive layer to which another opening portion is provided on both sides of the internal layer circuit board at a position corresponding to a position of the opening portion; previously forming two slits piercing the single-sided copper-clad laminate at corresponding positions placed outside from edges of the opening portion by a predetermined distance in accordance with opposed two sides of the opening portion; forming a required wiring pattern with respect to a conductive layer of each single-sided copper-clad laminate; and finally punching out the single-sided copper-clad laminate at a position including respective both ends of the two slits to take off unnecessary removal pieces, thereby exposing the opening portion of the internal layer circuit board including the terminal portion.

Here, the internal layer circuit board can be formed by a single-sided copper-clad laminate or a double-sided copper-clad laminate. Further, it is preferable that the slit is formed at a corresponding position placed outside from the edge of the opening portion by a distance of 0.2 mm to 1.0 mm. Moreover, as the interlayer adhesive layer, a material which also has a surface protection layer for the wiring pattern formed to the internal layer circuit board can be used.

BEST MODE FOR CARRYING OUT THE INVENTION

Figure 1:
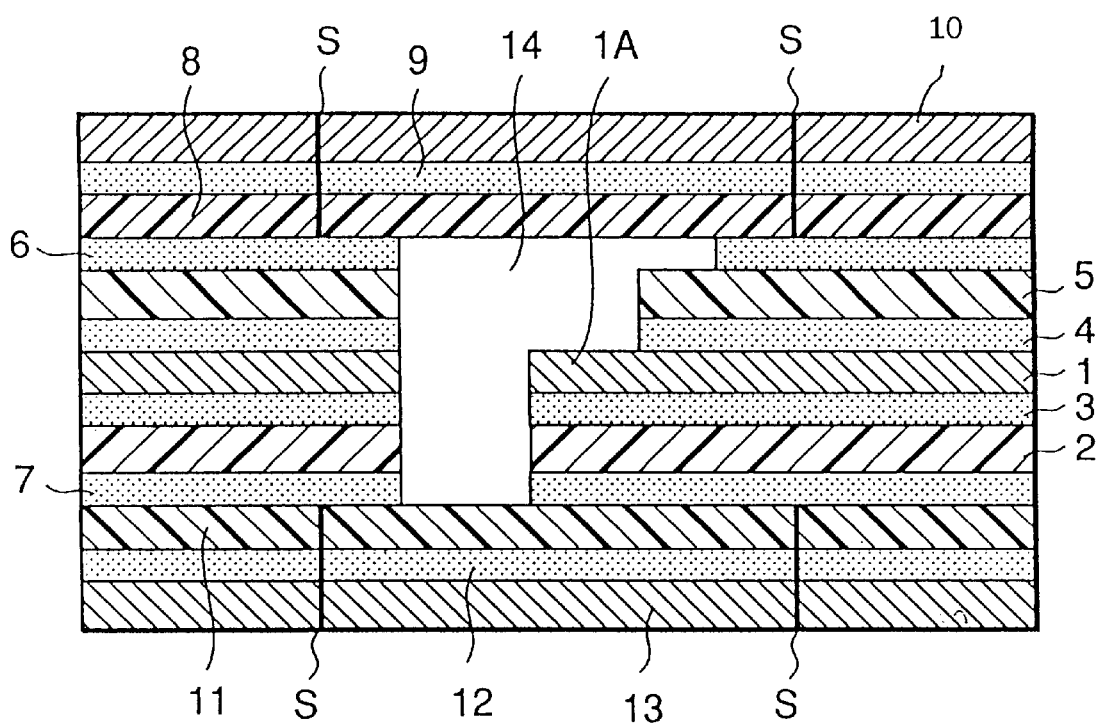
FIG. 1 is a view for explaining a method for manufacturing a flexible multilayer circuit board according to the present invention.

The present invention will now be described in detail hereinafter with reference to an illustrative embodiment. FIG. 1 is a view for explaining the method for manufacturing a flexible multilayer circuit board according to the present invention.

Figure 2:
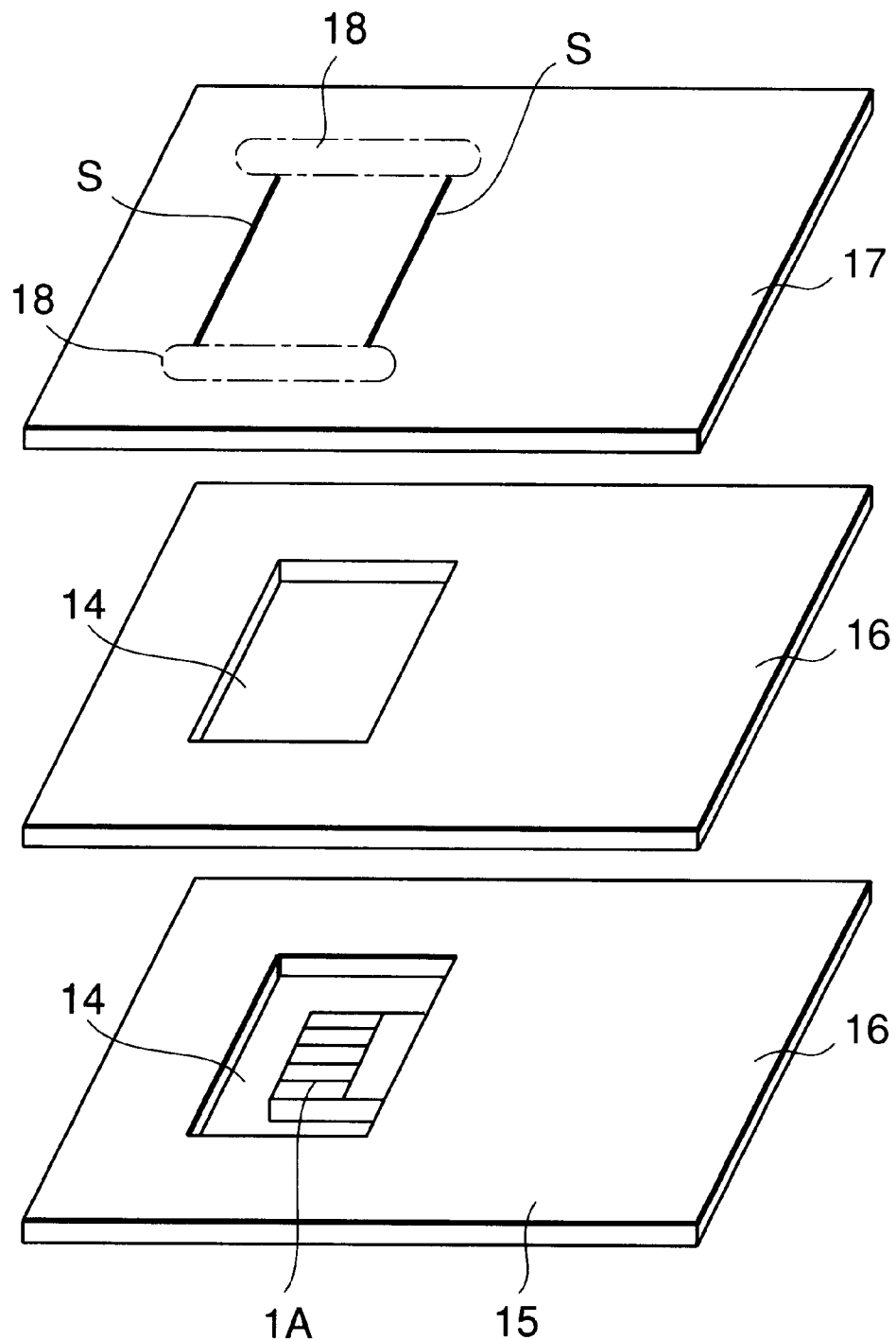
FIG. 2 is a conceptual perspective view partially showing the lamination state of an internal layer circuit board and an external layer circuit board illustrated in FIG. 1.

In the drawing, an internal layer circuit board 15 is constituted by a required wiring pattern 1 using a copper foil and the like on an appropriate insulating base material 2 such as a polyimide film through an adhesive layer 3, which is also apparent from FIG. 2. Although the internal layer circuit board 15 is constituted by using, e.g., a single-sided copper-clad laminate in FIG. 1, a double-sided copper-clad laminate may be typically used to provide required wiring patterns on both sides thereof according to need.

A terminal portion 1A required for external connection is formed to, e.g., an end portion of the wiring pattern 1, and a surface protection layer 5 consisting of a cover film and the like is formed to other regions of the wiring pattern 1 except the terminal portion 1A through the adhesive layer 4. Since the terminal portion 1A must be exposed to the outside eventually, an opening portion 14 which is large enough for exposing the part where the terminal portion 1A is made is formed to the internal layer circuit board 15. In addition, necessary gold plating or solder plating is performed to the terminal portion 1A.

As shown in FIG. 1, single-sided copper-clad laminates 17 consisting of insulating base materials 8 and 11, adhesive layers 9 and 12, conductive layers 10 and 13 such as copper foils are superimposed on both sides of the internal layer circuit board having the above-described structure through the respective interlayer adhesive layers 6 and 7. Thus, the opening portion 14 including the terminal portion 1A of the internal layer circuit board becomes hollow and sealed by both single-sided copper-clad laminates 17. Although only one single-sided copper-clad laminate 17 is shown in FIG. 2 for convenience sake, the single-sided copper-clad laminate 17 is also superimposed on the lower portion of the internal layer circuit board 15 by using the interlayer adhesive layer 16 with a cover film shown in FIG. 2. As apparent from the drawing, it is a matter of course that the opening portion 14 having a size and a shape corresponding to the opening portion 14 of the internal layer circuit board is provided to each of the interlayer adhesive layers 6 and 7.

Here, as schematically shown in FIGS. 1 and 2, two slits S piercing to reach the respective insulating base materials 8 and 11 are formed to each single-sided copper-clad laminate 17 which serves as a so-called cover body of the opening portion 14 at positions away from the edges of the opening portion 14 toward outside by a predetermined distance in accordance with two opposed sides of the opening portion 14, and the preparation is made so that the opening portion 14 can be opened in the final process. It is preferable that each slit S has the width of approximately 0.3 mm and is formed at a corresponding position placed outside from the edge of the opening portion 14 by a distance of 0.2 mm to 1.0 mm or more preferably 0.3 mm to 0.5 mm. As a result, a chemical liquid and the like does not enter the opening portion 14 in the etching process for forming a wiring pattern with respect to each single-sided copper-clad laminate 17 in order to form the external layer circuit board or the necessary through hole plating process with respect to the internal layer circuit board 15, and the terminal portion 1A of the internal layer circuit board 15 can be hence completely protected.

Figure 3:
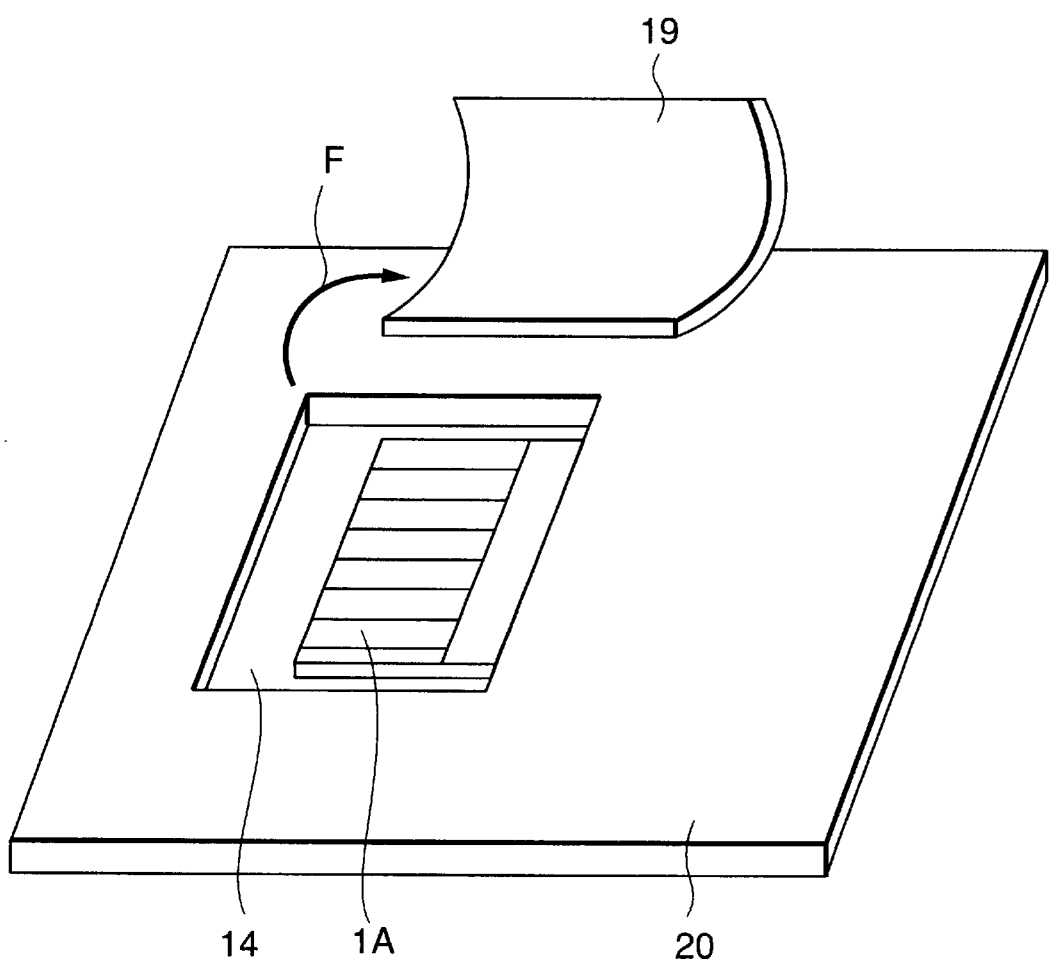
FIG. 3 is a view for explaining the state for taking off an unnecessary removal piece to expose a terminal portion of the internal layer circuit board.

Upon manufacturing each external layer circuit board as described above, as shown in FIGS. 2 and 3, an unnecessary removal piece 19 can be easily taken off as indicated by an arrow F by punching out each external layer circuit board so as to include the respective both ends of the slits S previously formed to the external layer circuit boards, e.g., so as to provide a punched out portion 18 in the long hole shape as indicated by a broken line. Consequently, the opening portion 14 including the terminal portion 1A of the sealed internal layer circuit board 15 is exposed to the outside, thereby obtaining a required flexible multilayer circuit board 20.

INDUSTRIAL APPLICABILITY

According to the method for manufacturing the flexible multilayer circuit board according to the present invention, since the external layer circuit board can be formed in the state the previously formed terminal portion of the internal layer circuit board is hermetically kept in the external layer circuit board, the flexible multilayer circuit board with the high quality can be produced in the simple process without adversely affecting the terminal portion of the internal layer circuit board.

What is claimed is:

1. A method for manufacturing a flexible multilayer circuit board comprising the steps of: producing an internal circuit board to which an opening portion is provided at a predetermined position and a required wiring pattern is formed so as to expose a terminal portion to said opening portion; laminating single-sided copper-clad laminates on both sides of said internal layer circuit board through each interlayer adhesive layer to which another opening portion is provided at a position corresponding to said opening portion; previously forming two piercing slits to said single-sided copper-clad laminates at corresponding positions placed outside from edges of said opening portion by a predetermined distance in accordance with two opposed sides of said opening portion; forming a required wiring pattern to a conductive layer of each of said copper-clad laminates; and finally taking off an unnecessary removal piece by punching out said copper-clad laminates at a position including respective both ends of said two slits, thereby exposing said opening portion of said internal layer circuit board including said terminal portion.

2. The method for manufacturing a flexible multilayer circuit board according to claim 1, wherein said internal layer circuit board is formed by a single-sided copper clad laminate or a double-sided copper-clad laminate.

3. The method for manufacturing a flexible multilayer circuit board according to claim 1, wherein said slit is formed at a corresponding position placed outside from an edge of said opening portion by a distance of 0.2 mm to 1.0 mm.

4. The method for manufacturing a flexible multilayer circuit board according to claim 1, wherein said interlayer adhesive layer also includes a surface protection layer for a wiring pattern formed to said internal layer circuit board.

* * * * *